US010031415B1

(12) United States Patent
Bernard et al.

(10) Patent No.: US 10,031,415 B1
(45) Date of Patent: Jul. 24, 2018

(54) METHOD TO TAYLOR MECHANICAL PROPERTIES ON MEMS DEVICES AND NANO-DEVICES WITH MULTIPLE LAYER PHOTOIMAGEABLE DRY FILM

(71) Applicant: Funai Electric Co., Ltd., Osaka (JP)

(72) Inventors: David L. Bernard, Lexington, KY (US); Christopher A. Craft, Lexington, KY (US); David C. Graham, Lexington, KY (US); Sean T. Weaver, Lexington, KY (US)

(73) Assignee: Funai Electric Co., Ltd. (JP)

( * ) Notice: Subject to any disclaimer, the term of this patent is extended or adjusted under 35 U.S.C. 154(b) by 0 days.

(21) Appl. No.: 15/682,502

(22) Filed: Aug. 21, 2017

(51) Int. Cl.
| | |
|---|---|
| *B41J 2/14* | (2006.01) |
| *G03F 7/00* | (2006.01) |
| *G03F 7/095* | (2006.01) |
| *G03F 7/038* | (2006.01) |
| *B81C 1/00* | (2006.01) |
| *B81B 1/00* | (2006.01) |
| *B41J 2/16* | (2006.01) |

(52) U.S. Cl.
CPC ............ *G03F 7/0037* (2013.01); *B41J 2/14* (2013.01); *B41J 2/162* (2013.01); *B41J 2/1631* (2013.01); *B81B 1/002* (2013.01); *B81C 1/00619* (2013.01); *G03F 7/0035* (2013.01); *G03F 7/038* (2013.01); *B81B 2201/052* (2013.01)

(58) Field of Classification Search
CPC ........ B41J 2/14; B41J 2/14129; B41J 2/1433; B41J 2/162; B41J 2/1623; B41J 2/1631; B41J 2/1634; B81B 1/002; B81C 1/00619; C08J 3/243; C08J 2363/00; C08L 63/00; C08L 63/10; G03F 7/0037; G03F 7/0035; G03F 7/03
See application file for complete search history.

(56) References Cited

U.S. PATENT DOCUMENTS

| | | | |
|---|---|---|---|
| 4,509,063 A | 4/1985 | Sugitani et al. | |
| 4,596,759 A | 6/1986 | Schupp et al. | |
| 5,458,254 A * | 10/1995 | Miyagawa | B41J 2/1603 216/27 |
| 5,478,606 A * | 12/1995 | Ohkuma | B41J 2/1603 216/27 |
| 6,139,761 A * | 10/2000 | Ohkuma | B41J 2/1603 216/27 |

(Continued)

*Primary Examiner* — Anh T. N. Vo
(74) *Attorney, Agent, or Firm* — Luedeka Neely Group, PC

(57) ABSTRACT

A three-dimensional ("3D") structure for handling fluids, a fluid handling device containing the 3D structure, and a method of making the 3D structure. The method includes providing a composite photoresist material that includes: (a) a first photoresist layer derived from a photoresist resin having a first chemical property selected from the group consisting of epoxide equivalent weight, aromatic content, and crosslink density and (b) at least a second photoresist layer derived from a photoresist resin having a second chemical property selected from the group consisting of epoxide equivalent weight, aromatic content, and crosslink density different from the first chemical property. The composite photoresist material is devoid of an adhesion promotion layer between layers of the composite photoresist material and the composite photoresist material has varying mechanical and/or physical properties through a thickness of the 3D structure.

17 Claims, 6 Drawing Sheets

(56) References Cited

U.S. PATENT DOCUMENTS

| | | | |
|---|---|---|---|
| 6,462,107 B1 | 10/2002 | Sinclair et al. | |
| 6,509,137 B1 * | 1/2003 | Wang | G03F 7/0035 |
| | | | 257/E21.027 |
| 6,709,805 B1 | 3/2004 | Patil | |
| 7,001,708 B1 | 2/2006 | Belfield | |
| 7,265,044 B2 | 9/2007 | Ohta et al. | |
| 7,481,942 B2 * | 1/2009 | Min | B41J 2/1603 |
| | | | 216/27 |
| 7,879,536 B2 | 1/2011 | Shin et al. | |
| 2005/0221232 A1 | 10/2005 | Baldwin et al. | |
| 2006/0284933 A1 | 12/2006 | Hatta | |
| 2009/0091600 A1 | 4/2009 | Fannin et al. | |
| 2009/0155729 A1 | 6/2009 | Weaver et al. | |
| 2009/0201338 A1 | 8/2009 | Weaver et al. | |
| 2011/0008732 A1 | 1/2011 | Ober et al. | |
| 2014/0374143 A1 | 12/2014 | Okamoto et al. | |
| 2015/0240071 A1 | 8/2015 | Okamoto et al. | |

* cited by examiner

METHOD TO TAYLOR MECHANICAL PROPERTIES ON MEMS DEVICES AND NANO-DEVICES WITH MULTIPLE LAYER PHOTOIMAGEABLE DRY FILM

TECHNICAL FIELD

The disclosure relates to MEMS and nano-devices, and in particular to improved methods for making three-dimensional photoimaged structures having varying degrees of physical and/or mechanical properties.

BACKGROUND AND SUMMARY

Micro-electromechanical systems ("MEMS") and nano-devices typically include three-dimensional ("3D") structures made from photoimaged materials. In some applications, it is necessary for the 3D structures to have varying degrees of physical and/or mechanical properties across a thickness of the photoimaged material. Examples of MEMS and nano-devices, include, but are not limited to fluid ejection heads, micro-filters, micro-separators, micro-sieves and other micro and nano scale fluid handling structures. Such structures may handle a wide variety of fluids. For example, fluid ejection heads are 3D nano-devices that are useful for ejecting a variety of fluids including inks, cooling fluids, pharmaceuticals, lubricants and the like. A widely used fluid ejection head is in an ink jet printer. However, fluid ejection heads may also be used in vaporization devices for vapor therapy, E-cigarettes and the like. New techniques are constantly being developed to provide low cost, highly reliable fluid ejection heads for such devices.

The fluid ejection head is a seemingly simple device that has a relatively complicated structure containing electrical circuits, ink passageways and a variety of tiny parts assembled with precision to provide a powerful, yet versatile fluid ejection head. The components of the ejection head must cooperate with each other and be useful for a variety of fluids and fluid formulations. Accordingly, it is important to match the ejection head components to the fluid being ejected. Slight variations in production quality can have a tremendous influence on the product yield and resulting ejection head performance.

The primary components of a fluid ejection head are a semiconductor substrate, a flow feature layer, a nozzle plate layer, and a flexible circuit attached to the substrate. The semiconductor substrate is preferably made of silicon and contains various passivation layers, conductive metal layers, resistive layers, insulative layers and protective layers deposited on a device surface thereof. Fluid ejection actuators formed on a device surface of the substrate may be thermal actuators or piezoelectric actuators. For thermal actuators, individual heater resistors are defined in the resistive layers and each heater resistor corresponds to a nozzle hole in the nozzle plate for heating and ejecting fluid from the ejection head toward a desired substrate or target.

Current methods used to make the fluid flow layer and nozzle plate layer involve the use the combination of spin on photoresist or dry film photoresist with multiple image, develop, and bake steps for each layer. For example, in a conventional process, a first adhesion promotion layer is applied to a semiconductor substrate, a fluid flow layer of photoimageable material is spin coated onto the adhesion layer. The fluid flow layer is a negative photo resist layer that is imaged, cured, and developed. A second adhesion promotion layer is applied to the fluid flow layer before applying a nozzle layer. Next the photoimageable layer nozzle layer is laminated as a dry film to the fluid flow layer by means of the secondary adhesion promotion layer. The nozzle layer is imaged, cured and developed. The semiconductor substrate is then deep reactive ion etched (DRIE) to form vias through the substrate. Since the fluid flow layer and nozzle layer are already attached to the substrate, the process latitude for the DRIE process is limited.

In an alternative process, the semiconductor substrate is first etched to form vias using the DRIE process before or after an adhesion promotion layer is applied to the substrate. Then the fluid flow layer and nozzle layer are applied to the substrate as dry films that are each imaged and developed. Each dry film requires a separate adhesion promotion layer. There is a risk of adhesion loss between layers with the application of each additional adhesion promotion layer.

In a variation of the alternative process, the DRIE process is conducted after the fluid flow layer is applied to the substrate and is imaged and developed. Subsequent to the DRIE process, the nozzle layer is laminated to the fluid flow layer and is imaged and developed.

Regardless of the process used, the use of multiple layers requiring multiple adhesion promotors increases the process time for making the fluid ejection heads and increases the risk of loss due to adhesion layer failure. Also, the MEMS or nano-scale devices having a 3D structure may require a layer that is hydrophilic and a layer that is hydrophobic in order to efficiently process a fluid through the device. The mechanical properties of the layers may also be different depending on the uses of the MEMs or nano-device. Accordingly, what is needed is a 3D structure and method for making the structure that enables varying physical and/or mechanical properties through a thickness of a composite photoresist layer that can be applied to a substrate with a single adhesion layer.

The disclosure provides a three-dimensional ("3D") structure for handling fluids, a fluid handling device containing the 3D structure, and a method of making the 3D structure. In one embodiment, the method includes providing a composite photoresist material that includes: (a) a first photoresist layer derived from a photoresist resin having a first chemical property selected from the group consisting of epoxide equivalent weight, aromatic content, and crosslink density and (b) at least a second photoresist layer derived from a photoresist resin having a second chemical property selected from the group consisting of epoxide equivalent weight, aromatic content, and crosslink density different from the first chemical property. The composite photoresist material is devoid of an adhesion promotion layer between layers of the composite photoresist material and the composite photoresist material has varying mechanical and/or physical properties through a thickness of the 3D structure.

In another embodiment, there is provided a method for making a three-dimensional ("3D") structure from a composite photoresist film. The method includes the steps of: (A) applying a first layer of photoresist material to a carrier film, the first layer being derived from a photoresist resin having a first chemical property selected from the group consisting of epoxide equivalent weight, aromatic content, and crosslink density; (B) drying the first layer to provide a dried first layer; (C) applying a second layer of photoresist material to the dried first layer, the second layer being derived from a photoresist resin having a second chemical property selected from the group consisting of epoxide equivalent weight, aromatic content, and crosslink density different from the first chemical property; (D) drying the second layer to provide a composite photoresist material devoid of intermediate adhesion layer(s); (E) applying an adhesion layer to a substrate surface; (F) laminating the composite photoresist material to the adhesion layer; (G) exposing the composite photoresist material to a first radiation exposure wavelength selected from e-line, g-line, h-line, i-line, mid ultraviolet (UV), and deep UV radiation; and (H) simultaneously developing the composite photoresist material to provide the 3D structure having varying mechanical and/or physical properties through a thickness of the 3D structure.

Another embodiment of the disclosure provides a fluid ejection device having a fluid ejection head that includes a semiconductor substrate containing a plurality fluid ejection actuators on a device surface thereof and one or more fluid supply vias etched therethrough. An adhesion promotion layer is applied to the device surface of the semiconductor substrate. A composite photoresist material is applied to the adhesion promotion layer wherein the composite photoresist material contains (a) a first photoresist layer derived from a photoresist resin having a first chemical property selected from the group consisting of epoxide equivalent weight, aromatic content, and crosslink density and (b) at least a second photoresist layer derived from a second photoresist resin having a second chemical property selected from the group consisting of epoxide equivalent weight, aromatic content, and crosslink density different from the first chemical property. The composite photoresist material is devoid of an adhesion promotion layer between layers of the composite photoresist material. A controller for activating the fluid ejection head is also provided.

In some embodiments, the composite photoresist material includes at least a third layer of photoresist material, wherein the third layer of photoresist material is derived from a third photoresist resin having a third chemical property selected from the group consisting of epoxide equivalent weight, aromatic content, and crosslink density that is different from the first and second chemical properties.

In some embodiments, the composite photoresist material has a thickness ranging from about 6 to about 150 µm.

In some embodiments, the composite photoresist material is imaged with a radiation exposure wavelength selected from e-line, g-line, h-line, i-line, mid ultraviolet (UV), or deep UV radiation.

In some embodiments, each photoresist layer of the composite photoresist material is imaged with a different radiation exposure wavelength selected from e-line, g-line, h-line, i-line, mid ultraviolet (UV), or deep UV radiation.

In some embodiments, one or more layers of the composite photoresist material includes a hydrophobicity agent.

A benefit of manipulating the mechanical and/or physical properties of each layer of the composite photoresist material is the ability to reduce stresses in MEMS or nano-devices. Accordingly, embodiments of the disclosure simplify and enable multiple layers of MEMS and nano structures to have varying mechanical and/or physical properties for use in a wide variety of applications.

Another advantage of the embodiments described herein is that the process steps for making 3D MEMS and nano-devices are greatly simplified as described in more detail below and provides devices in higher yields due to a decrease in lamination adhesion failures.

BRIEF DESCRIPTION OF THE DRAWINGS

Further features and advantages of the disclosed embodiments will become apparent by reference to the detailed description when considered in conjunction with the figures, which are not to scale, wherein like reference numbers indicate like elements through the several views, and wherein.

DETAILED DESCRIPTION OF THE EMBODIMENTS

With regard to embodiments of the disclosure, various MEMS and nano-devices may be made having the desired physical and/or mechanical properties throughout a thickness of a composite polymeric layer. An example of such a device is a fluid ejection head. Accordingly, for simplification purposes, the description is directed specifically to fluid ejection heads. However, the embodiments described herein may be adapted for use in making a wide variety of 3D MEMS and nano-devices as referenced above.

Figure 1:
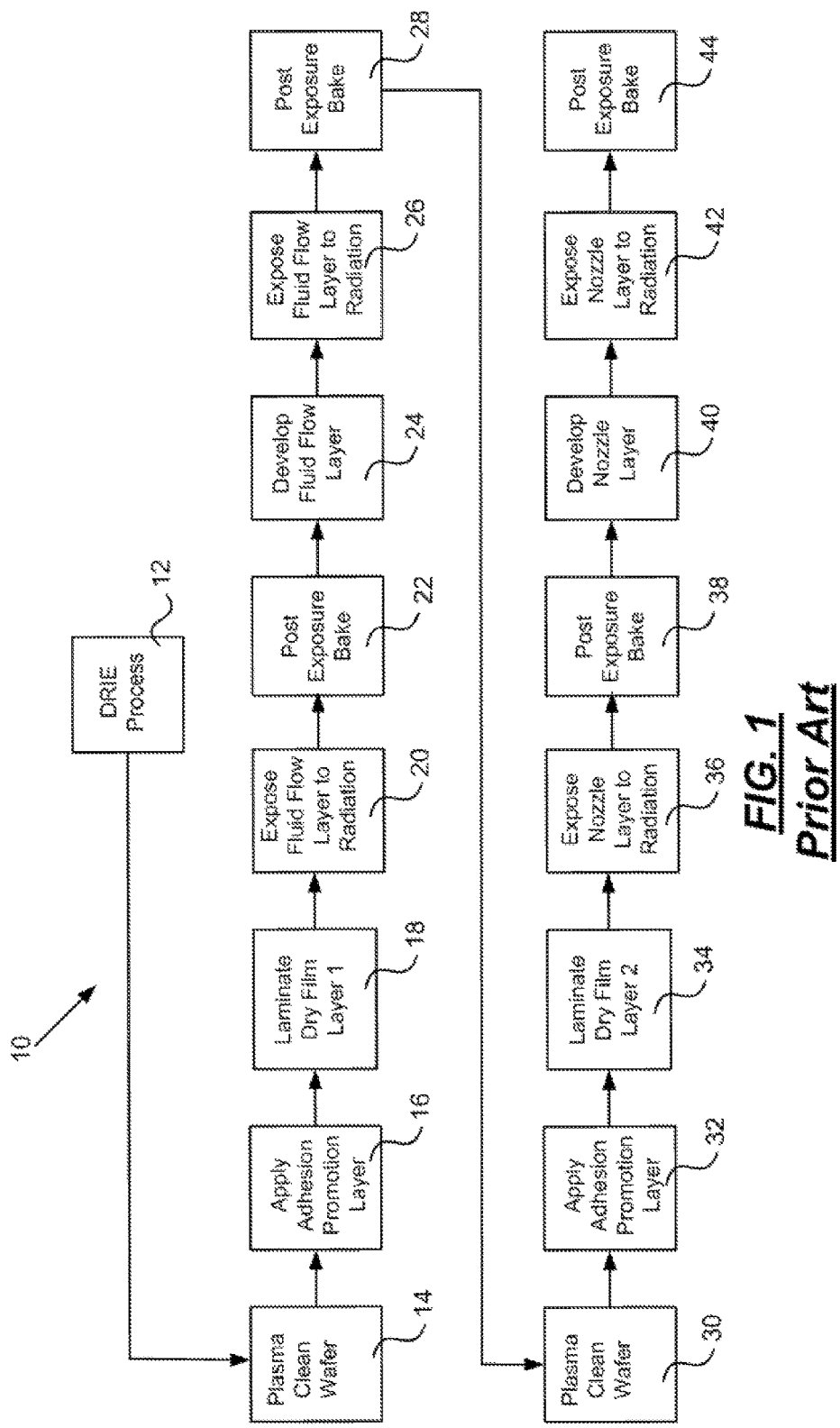
FIGS. 1-2 are flow diagrams of prior art processing steps for making a fluid ejection head.
Figure 2:
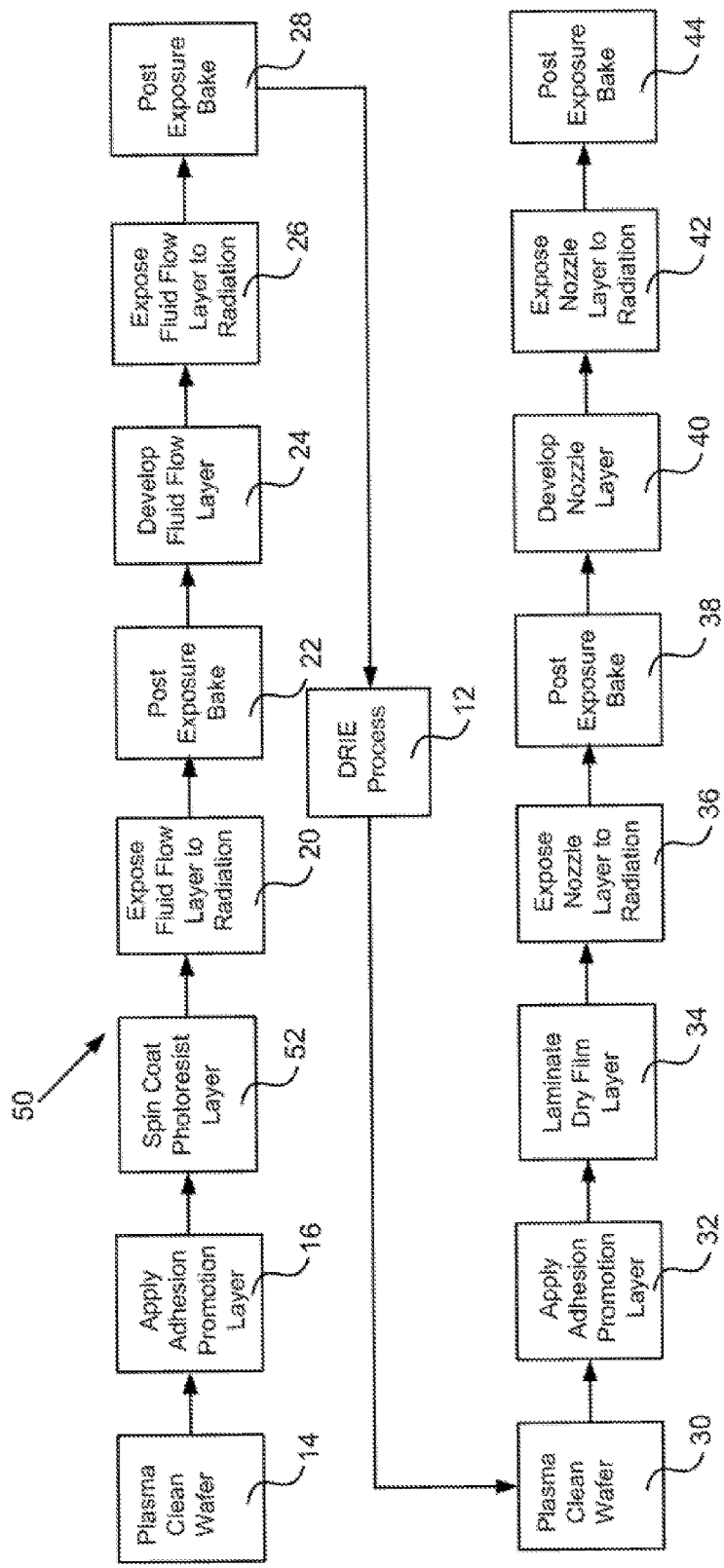

FIGS. 1 and 2, graphically illustrate block flow diagrams 10 and 50 of prior art process steps for making an ejection head. With reference to FIG. 1, the first step is a DRIE process 12 to etch fluid vias through a semiconductor substrate. Next, the substrate is plasma cleaned in step 14 and an adhesion promotion layer is applied to the substrate in step 16. A dry film layer that provides a fluid flow layer is applied to the adhesion layer in step 18. The fluid flow layer is exposed to radiation through a mask in step 20, and baked in step 22 to cure the exposed areas of the layer. Next the fluid flow layer is developed in step 24 to remove the masked areas of the fluid flow layer. The fluid flow layer is then exposed to ultraviolet (UV) radiation in step 26 and baked again in step 28 to remove any residual, photoacid generator, developer and/or uncured resin. The semiconductor substrate and fluid flow layer are plasma cleaned in step 30 and a second adhesion promotion layer is applied in step 32. A second dry film layer is laminated to the fluid flow layer in step 34 to provide a nozzle layer. The nozzle layer is exposed to radiation in step 36 to form nozzle holes in the nozzle layer. A second post exposure bake is performed in step 38 to cure the unmasked material in the nozzle layer in step 38. Next the nozzle layer is developed in step 40 to form the nozzle holes. The nozzle layer is exposed to UV radiation in step 42 and post exposure baked in step 44.

The primary differences between flow diagram 10 and flow diagram 50 is that in flow diagram 10, the DRIE process to form vias in the semiconductor substrate is conducted before any of the flow layers are applied to the substrate, whereas in diagram 50, the DRIE process is conducted after the fluid flow layer is applied to the substrate, exposed to radiation and developed. Since the semiconductor substrate does not already contain fluid vias, the fluid flow layer may can be spin-coated onto the substrate in step 52 rather than laminated to the adhesion layer. Otherwise, the process steps are similar to those described with reference to FIG. 1.

Figure 3:
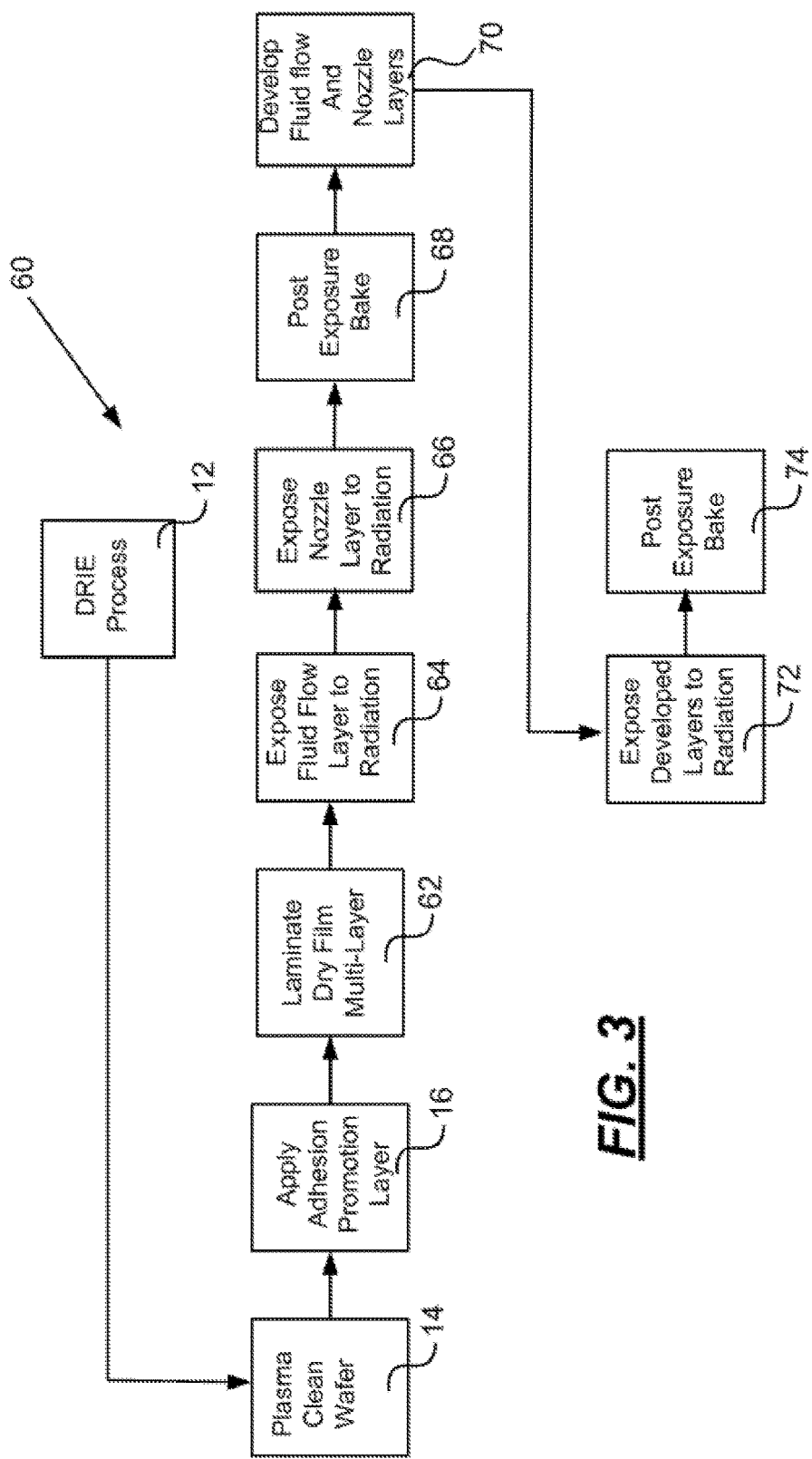
FIG. 3 is a flow diagram of process steps for making an ejection head according to an embodiment of the disclosure.

A simplified process 60 according to an embodiment of the disclosure is shown in FIG. 3. The first three steps of the process are similar to the first three steps of the prior art process 10. However, instead of laminating a single fluid flow layer to the substrate, a composite dry film layer is laminated in step 62 to the adhesion promotion layer. Next, the composite dry film layer is exposed to a first radiation source in step 64 through a mask to provide fluid flow features in the composite dry film layer. Prior to developing the fluid flow features, the composite dry film layer is exposed to a second radiation source through a second mask in step 66 to provide nozzle holes in the composite dry film layer. The composite dry film layer is then baked in step 68 to cure the masked areas of the composite dry film layer. In step 70, the composite dry film layer is developed to form fluid flow features and nozzle holes in the composite dry film layer. As in the prior art processes, the composite film layer is then exposed to UV radiation in step 72 and baked in step 74.

Figure 4A:
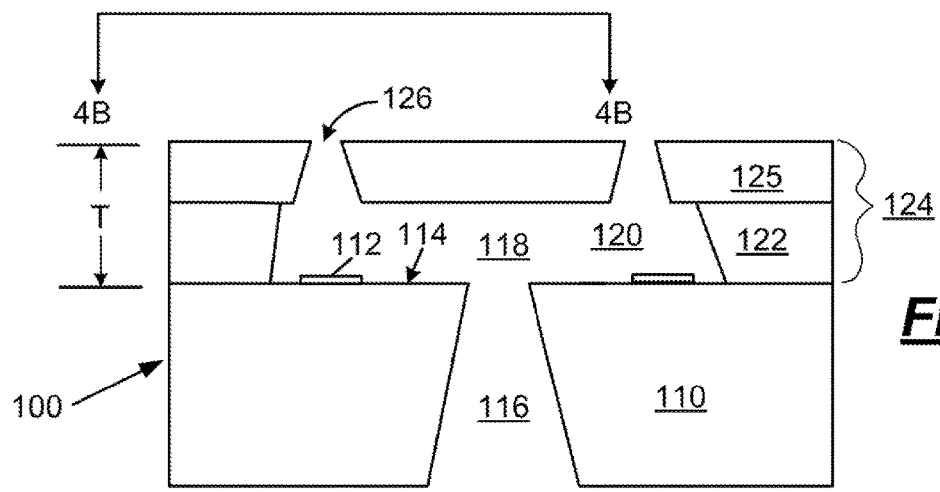
FIG. 4A is a schematic cross-sectional view, not to scale, of a portion of a fluid ejection head according to the disclosure.
Figure 4B:
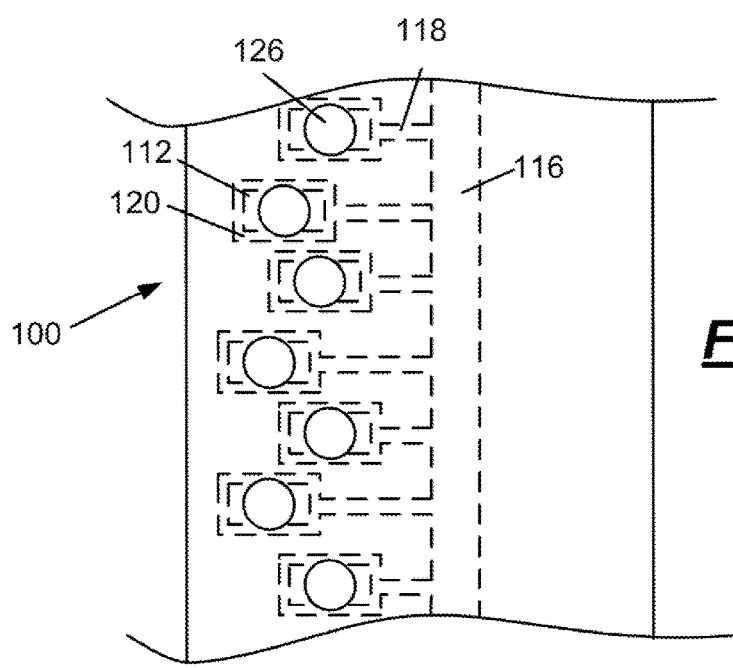
FIG. 4B is a plan schematic view, not to scale, of a portion of the fluid ejection head of FIG. 4A.

A portion of an ejection head 100 made by the foregoing process is illustrated in FIGS. 4A and 4B. The ejection head 100 includes a semiconductor substrate 110 that is preferably a silicon semiconductor substrate 110 containing a plurality of fluid ejection actuators such as piezoelectric devices or heater resistors 112 formed on a device side 114 of the substrate 110. Upon activation of heater resistors 112, fluid supplied through one or more fluid supply vias 116 in the semiconductor substrate 110 flows through a fluid supply channel 118 to a fluid chamber 120 in a portion 122 of the composite film layer 124 where the fluid is caused to be ejected through nozzle holes 126 in the composite film layer 124. Fluid ejection actuators, such as heater resistors 112, are formed on the device side 114 of the semiconductor substrate 110 by well-known semiconductor manufacturing techniques.

The semiconductor substrate 110 is relatively small in size and typically has overall dimensions ranging from about 2 to about 8 millimeters wide by about 10 to about 20 millimeters long and from about 0.4 to about 0.8 mm thick. In conventional semiconductor substrates 110, the fluid supply slots 116 are grit-blasted in the semiconductor substrates 110. Such slots 116 typically have dimensions of about 9.7 millimeters long and from about 50 to about 400 microns wide. Fluid may be provided to the fluid ejection actuators by a single one of the slots 116 or by a plurality of openings in the substrate 110 made by a dry etch process selected from reactive ion etching (RIE) or deep reactive ion etching (DRIE), inductively coupled plasma etching, and the like. The composite film layer 124 may be formed from one or more layers of negative photoresist material as described in more detail below. The composite film layer 124 may have a thickness T ranging from about 6 to about 150 μm or more, such as from about 10 to about 80 μm.

The fluid supply slot 116 directs fluid from a fluid reservoir to which the ejection head 100 is attached through the fluid supply slot 116 to the device side 114 of the substrate 110 containing heater resistors 112. The device side 114 of the substrate 110 also preferably contains electrical tracing from the heater resistors 112 to contact pads used for connecting the substrate 110 to a flexible circuit or a tape automated bonding (TAB) circuit for supplying electrical impulses from a fluid ejection controller to activate one or more heater resistors 112 on the substrate 110.

Each of the layers of the composite film layer 124 may require different physical and/or mechanical properties depending configuration of ejection head 100 or the fluid being handled by the ejection head 100. For example, the fluid chambers 120 in the portion 122 of the composite film may be exposed to higher temperatures than a portion 125 of the composite film containing the nozzle holes 126. Also, it may be desirable for the fluid supply channels 118 and fluid chambers 120 to be more hydrophilic than the nozzle holes 126 so that the fluid flow easily from the fluid supply via 116 through the fluid supply channels 118 to the fluid chambers 120. Likewise, it may be necessary for the portion 125 of the composite film to have hydrophobic properties so that fluid ejection through the nozzle holes 126 does not accumulate and dry on the portion 125 causing plugging of the nozzle holes 126. Since layer 124 may be exposed to higher fluid temperatures than portion 125 of the composite film, it may be necessary for the composite film layer 124 to have varying stress relieving properties through the thickness T of the composite film layer 124.

Figure 5:
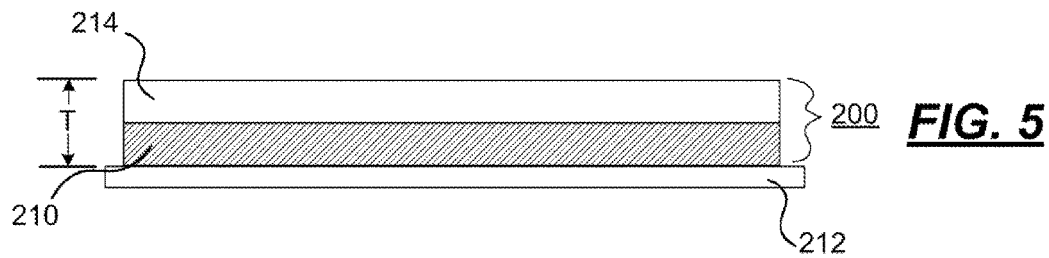
FIG. 5 is a cross-sectional view, not to scale, of a double-layer photoresist material according to an embodiment of the disclosure.

With reference to FIG. 5, there is illustrated a composite photoresist film layer 200 attached to a carrier film 212. The composite photoresist film layer 200 includes a first layer 210 that derived from a photoresist resin having a first chemical property selected from the group consisting of epoxide equivalent weight, aromatic content, and crosslink density. For example, the first layer 210 may be made from a hydrophilic resin having a low cross-linked density relative to the cross-link density of a second layer 214. The first layer also contains a first photoacid generator having at least a first radiation exposure wavelength. The wavelength of the photoacid generator in the first layer 210 may be selected from e-line, g-line, h-line, i-line, mid UV, and deep UV radiation. The first radiation exposure wavelength, in some embodiments, may be greater than 350 nm. The thickness of the first layer 210 may range from about 3 to about 50 μm.

The composite film layer 200 may also contain the second layer 214 that is formulated with a photoresist resin having a second chemical property selected from the group consisting of epoxide equivalent weight, aromatic content, and crosslink density that is different from the first chemical property. For example, the second layer 214 may be made from a hydrophobic or hydrophilic resin having a medium cross-linked density relative to the cross-linked density of the first layer 210. The second layer 214 may contain a second photoacid generator having a second radiation exposure wavelength that is different from the first radiation exposure wavelength. The second radiation exposure wavelength may be selected from e-line, g-line, h-line, i-line, mid UV, and deep UV radiation. In some embodiments, the second radiation exposure wavelength may be less than 350 nm. The second layer 214 may have a thickness ranging from about 3 to about 100 μm.

The wavelengths provided by the radiations sources that may be used according to embodiments of the disclosure are as follows:
e-line=546 nm
g-line=435 nm
h-line=405 nm
i-line=365 nm
mid UV=310 nm
deep UV=254 nm.

The photoresist materials that contain the photoacid generators may be formulated to include one or more of a multi-functional epoxy compound, a di-functional epoxy compound, a relatively high molecular weight polyhydroxy ether, an adhesion enhancer, and an aliphatic ketone solvent. For purposes of the disclosure, "difunctional epoxy" means epoxy compounds and materials having only two epoxy functional groups in the molecule. "Multifunctional epoxy" means epoxy compounds and materials having more than two epoxy functional groups in the molecule.

The di-functional epoxy component may be selected from di-functional epoxy compounds which include diglycidyl ethers of bisphenol-A, 3,4-epoxycyclohexylmethyl-3,4-epoxycyclo-hexene carboxylate, 3,4-epoxy-6-methylcyclo-hexylmethyl-3,4-epoxy-6-methylcyclohexene carboxylate, bis(3,4-epoxy-6-methylcyclohexylmethyl) adipate, and bis (2,3-epoxycyclopentyl) ether. Representative difunctional epoxy compounds may be selected from, but not limited to, the following compounds:

Difunction Epoxy Compound 1

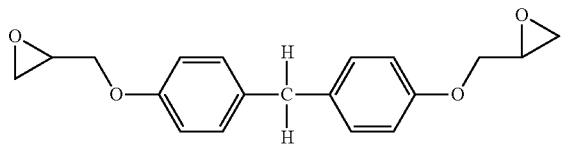 [SMILES: c1cc(OCC2CO2)ccc1Cc1ccc(OCC2CO2)cc1]

Difunctional Epoxy Compound 2

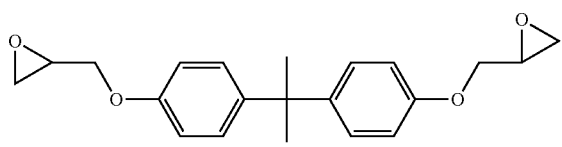

Difunctional Epoxy Compound 3

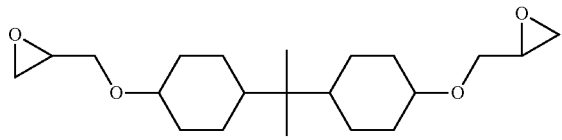 [SMILES: CC(C)(C1CCC(OCC2CO2)CC1)C1CCC(OCC2CO2)CC1]

Difunctional Epoxy Compound 4

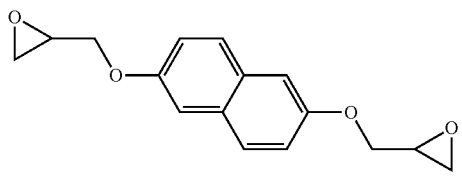 [SMILES: c1cc2cc(OCC3CO3)ccc2cc1OCC1CO1]

Difunctional Epoxy Compound 5

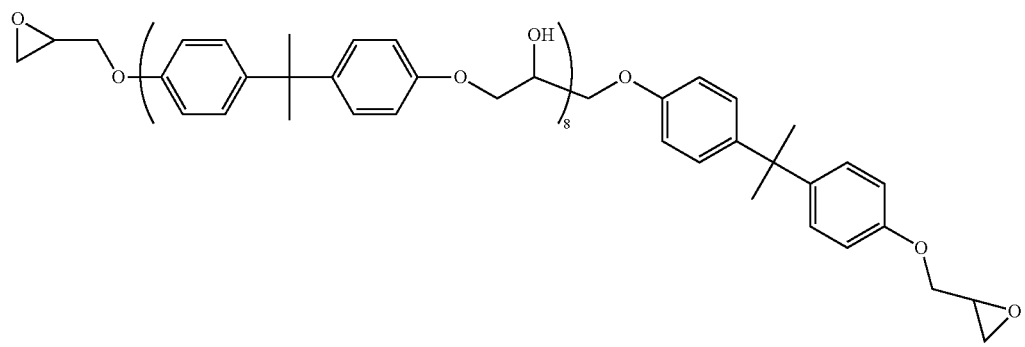

Difunctional Epoxy Compound 6

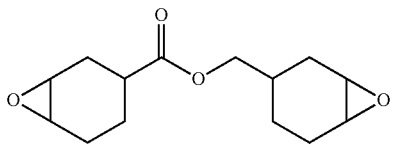 [SMILES: O=C(OCC1CCC2OC2C1)C1CCC2OC2C1]

An exemplary di-functional epoxy component is a bisphenol-A/epichlorohydrin epoxy resin having an epoxide equivalent weight ranging from about 170 to about 175 Daltons. An "epoxide equivalent weight" is the number of grams of resin containing 1 gram-equivalent of epoxide. The epoxide equivalent weight of the first di-functional epoxy component typically ranges from about 136 to about 2300 Daltons. The amount of the first di-functional epoxy component in the photoresist formulation may range from about 30 to about 50 percent by weight based on the weight of the cured resin.

A suitable multifunctional epoxy component for making a photoresist formulation used for the composite film layer 200 or 240 (FIG. 9) according to one embodiment of the disclosure, may be selected from aromatic epoxides such as glycidyl ethers of polyphenols. Exemplary multifunctional epoxy compounds may be selected from, but not limited to, the following compounds:

Multifunctional Epoxy Compound 1

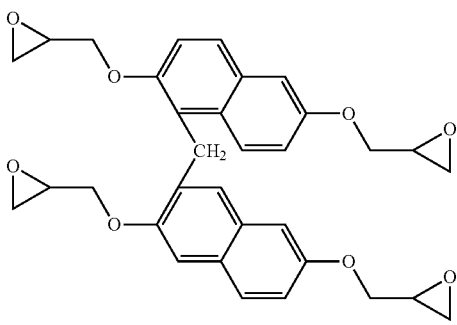 [SMILES: c1cc2cc(OCC3CO3)c(Cc3c(OCC4CO4)ccc4cc(OCC5CO5)ccc34)cc2cc1OCC1CO1]

Multifunctional Epoxy Compound 2

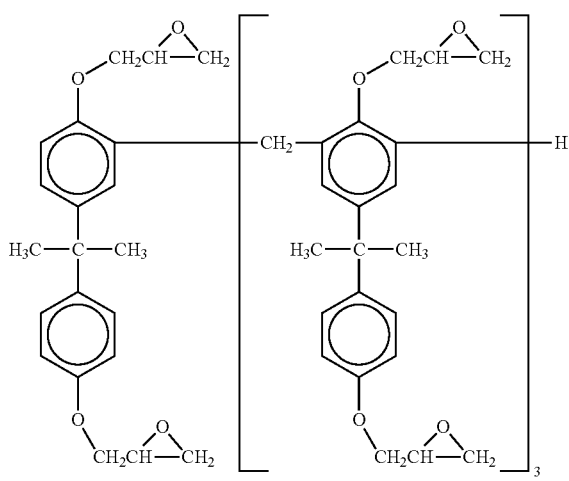

Multifunctional Epoxy Compound 3

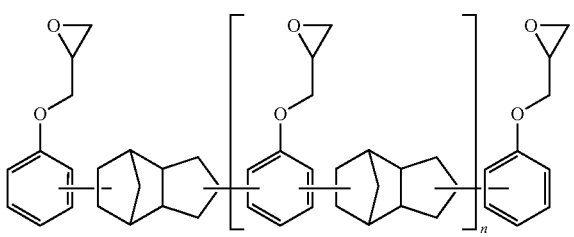

Multifunctional Epoxy Compound 4

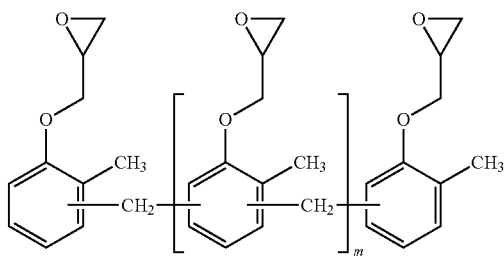

Multifunctional Epoxy Compound 5

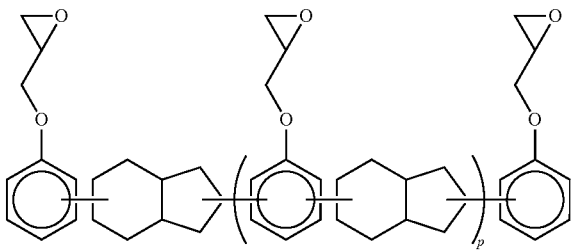

wherein n, m, and p are integers representing the number of repeat units in each of the polymers. The aromatic content in weight percent of Compounds 3-5 is calculated based on n, m and p=1.

An exemplary multi-functional epoxy resin is a polyglycidyl ether of a phenolformaldehyde novolac resin such as a novolac epoxy resin having an epoxide equivalent weight ranging from about 190 to about 250 Daltons and a viscosity at 130° C. ranging from about 10 to about 60.

The multi-functional epoxy component of the photoresist formulation may have a epoxide equivalent weight ranging from about 166 to about 286 Daltons as determined by gel permeation chromatography, and an average epoxide group functionality of greater than 3, preferably from about 4 to about 10. The amount of multifunctional epoxy resin in an exemplary photoresist formulation may range from about 30 to about 50 percent by weight based on the weight of the cured thick film layer 80.

Exemplary photoacid generators include compounds or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating acid moieties which initiate reactions with epoxides. The photoacid generator may be present in the photoresist formulation in an amount ranging from about 5 to about 25 weight percent based on the weight of the cured resin.

Compounds that generate a protic acid when irradiated by active rays, may be used as the photoacid generator, including, but are not limited to, aromatic iodonium complex salts and aromatic sulfonium complex salts. Examples include di-(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, triphenylsulfonium triflate, triphenylsulfonium hexafluorophosphate, triphenylsulfonium hexafluoroantimonate, triphenylsulfonium tetrakis(pentafluorophenyl)borate, 4,4'-bis[diphenylsulfonium]diphenylsulfide, bis-hexafluorophosphate, 4,4'-bis[di([beta]-hydroxyethoxy)phenylsulfonium]diphenylsulfide bis-hexafluoroantimonate, 4,4'-bis[di([beta]-hydroxyethoxy)(phenylsulfonium)diphenyl sulfide-bishexafluorophosphate 7-[di(p-tolyl)sulfonium]-2-isopropylthioxanthone hexafluorophosphate, 7-[di(p-tolyl)sulfonio-2-isopropylthioxanthone hexafluoroantimonate, 7-[di(p-tolyl)sulfonium]-2-isopropyl tetrakis(pentafluorophenyl)borate, phenylcarbonyl-4'-diphenylsulfonium diphenylsulfide hexafluorophosphate, phenylcarbonyl-4'-diphenylsulfonium diphenylsulfide hexafluoroantimonate, 4-tert-butylphenylcarbonyl-4'-diphenylsulfonium diphenylsulfide hexafluorophosphate, 4-tert-butylphenylcarbonyl-4'-diphenylsulfonium diphenylsulfide hexafluoroantimonate, 4-tert-butylphenylcarbonyl-4'-diphenylsulfonium diphenylsulfide tetrakis(pentafluorophenyl)borate, diphenyl [4-(phenylthio)phenyl]sulfonium hexafluoroantimonate and the like.

The hydrophobicity agent that may be used in one or more layers of the composite photoresist material include silicon containing materials such as silanes and siloxanes. Accordingly, the hydrophobicity agent may be selected from heptadecafluoro-decyltrimethoxysilane, octadecyldimethylchlorosilane, ocatadecyltri-cholorsilane, methytrimethoxysilane, octyltriethoxysilane, phenyltrimethoxysilane, t-butylmethoxysilane, tetraethoxysilane, sodium methyl siliconate, vinytri-methoxysilane, N-(3-(trimethoxylsilyl)propyl)ethylenediamine polymethylmethoxy-siloxane, polydimethylsiloxane, polyethylhydrogensiloxane, and dimethyl siloxane. The amount of hydrophobicity agent in the cured composite film may about 0.5 to about 2 weight percent, such as from about 1.0 to about 1.5 weight percent based on total weight of the cured resin, including all ranges subsumed therein.

An exemplary solvent for use in the photoresist formulation is a solvent which is non-photoreactive. Non-photoreactive solvents include, but are not limited gamma-butyrolactone, $C_{1-6}$ acetates, tetrahydrofuran, low molecular weight ketones, mixtures thereof and the like. The non-photoreactive solvent is present in the formulation mixture used to provide the composite film layer 124 in an amount ranging from about 20 to about 90 weight percent, such as from about 40 to about 60 weight percent, based on the total weight of the photoresist formulation. In an exemplary embodiment, the non-photoreactive solvent does not remain in the cured composite film layer and is thus removed prior to or during the composite film layer curing steps.

The photoresist formulation may optionally include an effective amount of an adhesion enhancing agent such as a silane compound. Silane compounds that are compatible with the components of the photoresist formulation typically have a functional group capable of reacting with at least one member selected from the group consisting of the multifunctional epoxy compound, the difunctional epoxy compound and the photoinitiator. Such an adhesion enhancing agent may be a silane with an epoxide functional group such as 3-(guanidinyl)propyltrimethoxysilane, and a glycidoxyalkyltrialkoxysilane, e.g., gamma-glycidoxypropyltrimethoxysilane. When used, the adhesion enhancing agent can be present in an amount ranging from about 0.5 to about 2 weight percent, such as from about 1.0 to about 1.5 weight percent based on total weight of the cured resin, including all ranges subsumed therein. Adhesion enhancing agents, as used herein, are defined to mean organic materials soluble in the photoresist composition which assist the film forming and adhesion characteristics of the composite film layer 200 or 240 adjacent the device surface 114 of the substrate 110.

Representative formulations for layers 210 and 214 are illustrated below in Tables 1-9. The amount of each component in the formulation is given in pounds per hundred pounds of resin (phr). All of the formulations in the following tables contained an iodonium complex salt as the photoacid generator. The phenoxy resin that was used was a compound of the formula

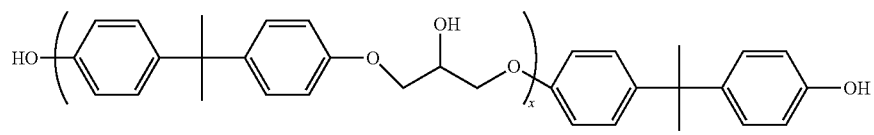

wherein x is the number of repeat units in the polymer. The phenoxy resin had a number average molecular weight of 52,000 Daltons.

TABLE 1

| Formula No. | Phenoxy Resin | Multi-functional Epoxy Comp. 2 | Di-functional Epoxy Comp. 2 | Photoacid generator | Epoxide Equivalent weight (EEW) | Average Aromatic content (wt. %) | Cross-Link Density (10° C. Tan Delta) | Cross-Link Density (30° C. Tan Delta) |
|---|---|---|---|---|---|---|---|---|
| 1 | 40 | 30 | 30 | 22.2 | 249-273 | 48.0 | 22.4 | 11.3 |
| 2 | 40 | 40 | 20 | 22.2 | 254-285 | 48.0 | 21.6 | 5.8 |
| 3 | 40 | 35 | 25 | 22.2 | 252-279 | 48.0 | 13.3 | 4.4 |
| 4 | 30 | 45 | 25 | 22.2 | 244-271 | 42.6 | 49.4 | 30.7 |
| 5 | 20 | 55 | 25 | 11.1 | 212-238 | 37.2 | 125.1 | 87.1 |
| 6 | 20 | 55 | 25 | 22.2 | 238-267 | 37.2 | 5.6 | 0.2 |
| 7 | 40 | 0 | 60 | 22.2 | 233-239 | 48.0 | 5.5 | 3.3 |

TABLE 2

| Formula No. | Phenoxy Resin | Multi-functional Epoxy Comp. 2 | Di-functional Epoxy Comp. 4 | Photoacid generator | Epoxide Equivalent weight (EEW) | Average Aromatic Content (wt. %) | Cross-Link Density (10° C. Tan Delta) | Cross-Link Density (30° C. Tan Delta) |
|---|---|---|---|---|---|---|---|---|
| 8 | 40 | 30 | 30 | 22.2 | 220-248 | 48.6 | 18.8 | 10.2 |
| 9 | 40 | 0 | 60 | 22.2 | 186-203 | 49.2 | 5.2 | 2.1 |
| 10 | 40 | 20 | 40 | 22.2 | 207-230 | 48.8 | 28.6 | 12.5 |
| 11 | 40 | 20 | 40 | 11.1 | 179-199 | 48.8 | 13.8 | 0.6 |

TABLE 3

| Formula No. | Phenoxy Resin | Multi-functional Epoxy Comp. 5 | Di-functional Epoxy Comp. 4 | Photoacid generator | Epoxide Equivalent weight (EEW) | Average Aromatic Content (wt. %) | Cross-Link Density (10° C. Tan Delta) | Cross-Link Density (30° C. Tan Delta) |
|---|---|---|---|---|---|---|---|---|
| 12 | 40 | 30 | 30 | 22.2 | 250-268 | 45.6 | 20.7 | 9.7 |
| 13 | 40 | 40 | 20 | 22.2 | 281-299 | 44.4 | 12.8 | 6.1 |

TABLE 4

| Formula No. | Phenoxy Resin | Multi-functional Epoxy Comp. 2 | Multi-functional Epoxy Comp. 5 | Di-functional Epoxy Comp. 2 | Photoacid generator | Epoxide Equivalent weight (EEW) | Average Aromatic Content (wt. %) | Cross-Link Density (10° C. Tan Delta) | Cross-Link Density (30° C. Tan Delta) |
|---|---|---|---|---|---|---|---|---|---|
| 14 | 40 | 35 | 10 | 15 | 22.2 | 271-301 | 47.0 | 24.5 | 14.5 |

TABLE 5

| Formula No. | Phenoxy Resin | Di-functional Epoxy Comp. 2 | Di functional Epoxy Comp. 5 | Photoacid generator | Epoxide Equivalent weight (EEW) | Average Aromatic Content (wt. %) | Cross-Link Density (10° C. Tan Delta) | Cross-Link Density (30° C. Tan Delta) |
|---|---|---|---|---|---|---|---|---|
| 15 | 40 | 30 | 30 | 22.2 | 423-447 | 51.9 | 2.0 | 1.2 |

TABLE 6

| Formula No. | Phenoxy Resin | Multi-functional Epoxy Comp. 1 | Di-functional Epoxy Comp. 2 | Photoacid generator | Epoxide Equivalent weight (EEW) | Average Aromatic Content (wt. %) | Cross-Link Density (10° C. Tan Delta) | Cross-Link Density (30° C. Tan Delta) |
|---|---|---|---|---|---|---|---|---|
| 16 | 40 | 30 | 30 | 22.2 | 226-234 | 48.3 | 21.7 | 14.0 |

TABLE 7

| Formula No. | Phenoxy Resin | Multi-functional Epoxy Comp. 1 | Di-functional Epoxy Comp. 4 | Photoacid generator | Epoxide Equivalent weight (EEW) | Average Aromatic Content (wt. %) | Cross-Link Density (10° C. Tan Delta) | Cross-Link Density (30° C. Tan Delta) |
|---|---|---|---|---|---|---|---|---|
| 17 | 40 | 30 | 30 | 22.2 | 205-215 | 48.9 | 25.0 | 13.3 |

TABLE 8

| Formula No. | Phenoxy Resin | Multi-functional Epoxy Comp. 3 | Di-functional Epoxy Comp. 4 | Photoacid generator | Epoxide Equivalent weight (EEW) | Average Aromatic Content (wt. %) | Cross-Link Density (10° C. Tan Delta) | Cross-Link Density (30° C. Tan Delta) |
|---|---|---|---|---|---|---|---|---|
| 18 | 40 | 30 | 30 | 22.2 | 239-256 | 45.0 | 66.8 | 9.5 |

TABLE 9

| Formula No. | Phenoxy Resin | Multi-functional Epoxy Comp. 4 | Di-functional Epoxy Comp. 4 | Photoacid generator | Epoxide Equivalent weight (EEW) | Average Aromatic Content (wt. %) | Cross-Link Density (10° C. Tan Delta) | Cross-Link Density (30° C. Tan Delta) |
|---|---|---|---|---|---|---|---|---|
| 19 | 40 | 30 | 30 | 22.2 | 226-242 | 48.6 | 39.6 | 18.9 |

Using the formulas from the foregoing tables 1-9, the properties of each photoresist layer may be selected in order to provide the composite film 200 having the desired chemical resistance, flexibility, stability, and the like when cured. Thus, each layer of the composite film 200 may be provided with different properties as desired for the particular MEMS or nano-device application through the thickness T of the composite layer 200.

Figure 6:
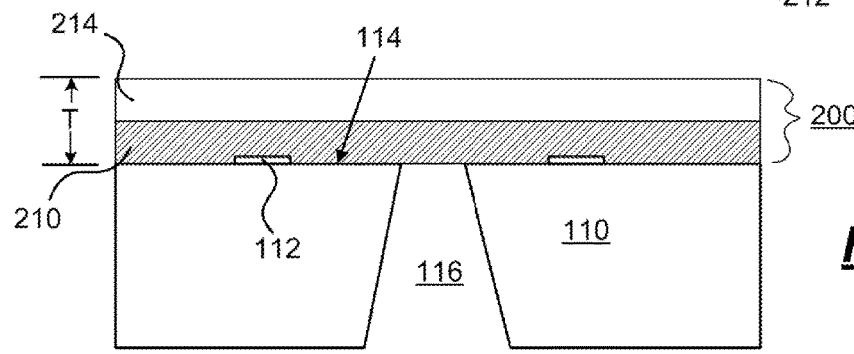
FIGS. 6-8 are schematic views, not to scale, of steps for making a fluid ejection head according to an embodiment of the disclosure.

In order to provide the composite film layer 200, the first layer 210 of photoresist resin may be coated onto the carrier film 212 and dried. Next the second layer 214 of photoresist resin may be coated onto the first layer 210 and dried. The composite dry film layer 200 may then be removed from the carrier film 212 and laminated to the device surface 114 of the substrate 110 as shown in FIG. 6 according to step 62 (FIG. 3).

Figure 7:
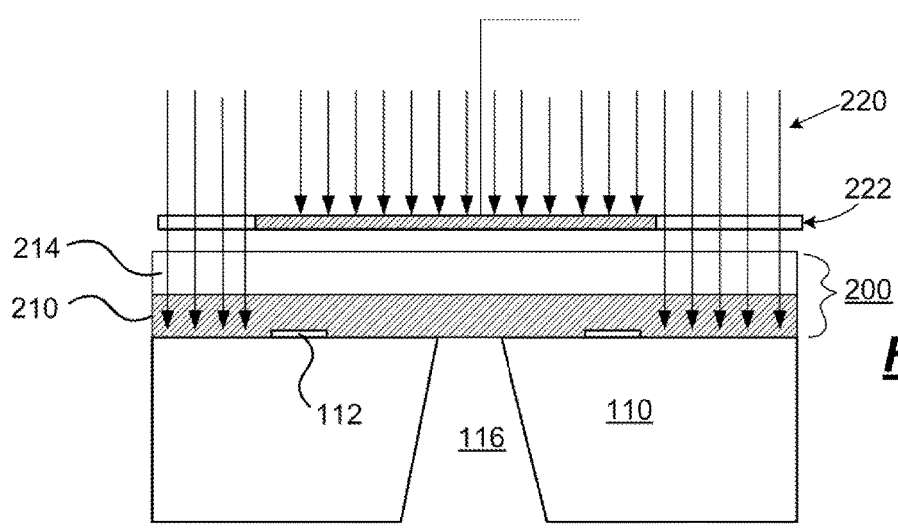
Figure 8:
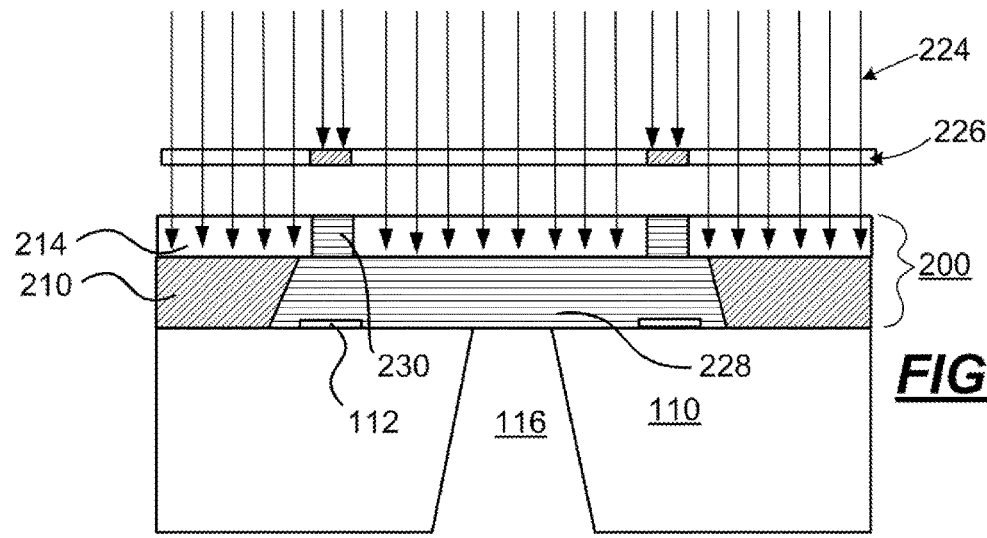

With reference to FIG. 7, the first layer 210 may be exposed to e-line, g-line, K-line, i-line, mid UV, or deep UV radiation 220 through a mask 222 to provide formation of the flow features in the first layer 210 of the composite film layer 200. Next, as shown in FIG. 8, the second layer 214 of the composite film layer 200 is exposed to e-line, g-line, h-line, i-line, mid UV, or deep UV radiation 224 through a second mask 226 to provide the nozzle features in the second layer 214 of the composite film. FIG. 8 illustrates the undeveloped flow features 228 and undeveloped nozzle features 230 in the composite film layer 200.

After exposing the composite film 200 to radiation, the composite film layer 200 is heated to cross-link the photoresist material in the exposed areas thereof. A developer solvent is then applied to the substrate 110 and composite film layer 200 to remove uncured photoresist material thereby forming the fluid supply channels 118 (FIGS. 4A-4B), fluid chambers 120, and nozzle holes 126 therein. In one embodiment, the substrate 110 containing the radiation exposed composite film layer 200 is placed in a developer bath using megasonic agitation to dissolve the uncrosslinked materials in both the first layer 210 and the second layer 214 so that the uncrosslinked material from the layer 210 is dissolved through the previously formed via 116 and the uncrosslinked material from 214 is dissolved to form the nozzle holes 126 in layer 214. Illustrative developers used in the developer bath include, for example, butyl cellosolve acetate, cyclohexanone, methyl ethyl ketone, a xylene and butyl cellosolve acetate mixture, and $C_{1-6}$ acetates like butyl acetate, or a combination of two or more of the foregoing. A third heating step at a temperature of about 200° C. for about 2 hours may be used to remove any residual photoacid generator that may be in the composite film layer 200.

Figure 9:
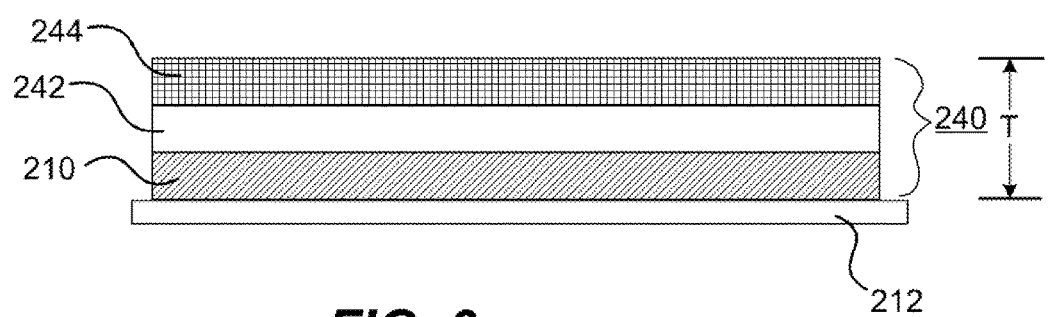
FIG. 9 is a cross-sectional view, not to scale, of a triple-layer photoresist material according to an embodiment of the disclosure.

In an alternative embodiment illustrated in FIG. 9, the composite film layer 240 may attached to the carrier film 212. The composite photoresist film layer 240 includes the first layer 210 described above. The thickness of the first layer 210 may range from about 3 to about 50 μm. The composite film layer 240 may also contain the second layer 242 described above. The second layer 242 may have a thickness ranging from about 3 to 50 μm. In one embodiment, a third layer 244 formulated from a hydrophilic third photoresist resin having a high cross-linked density may be applied to the second layer 242. The third layer 244 may have a thickness ranging from about 3 to about 50 μm and may be exposed to e-line, g-line, h-line, i-line, mid UV, or deep UV radiation through a mask to form flow features in the third layer 244.

By using the composite film layers 200 and 240 described above, the use of multiple adhesion promotion steps for making the fluid ejection head may be avoided. Also, as shown above, each layer may have different physical properties due to the chemical properties of the formulations used to make the layers. Since the formulations of each layer are similar, except for the chemical properties of epoxide equivalent weight, crosslink density or aromatic content, the layers will mix and adhere to each other at the interface between the layers without the need for an adhesion promotion layer. The type of photoacid generator and amount of green dye may be varied in the layers to further enhance the radiation wavelengths needed to image the layers.

As described above, each layer may have a different mechanical property depending on the chemical properties of the photoresist resin used in each layer. Accordingly, a MEMS or nano-device having multiple physical properties may enable tailoring of specific layers' physical properties to help create micro-filters, micro-separators, micro-sieves and other micro and nano scale fluid handling structures.

Having described various aspects and embodiments of the disclosure and several advantages thereof, it will be recognized by those of ordinary skills that the embodiments are susceptible to various modifications, substitutions and revisions within the spirit and scope of the appended claims.

What is claimed is:

1. A three-dimensional ("3D") structure comprising a composite photoresist material that includes: (a) a first photoresist layer derived from a photoresist resin having a first chemical property selected from a group consisting of epoxide equivalent weight, aromatic content, and crosslink density and (b) at least a second photoresist layer derived from a photoresist resin having a second chemical property selected from a group consisting of epoxide equivalent weight, aromatic content, and crosslink density, wherein the second chemical property is different from the first chemical property and wherein the composite photoresist material has varying mechanical and/or physical properties through a thickness of the 3D structure.

2. The 3D structure of claim 1, wherein a composite photoresist material comprises at least a third layer of photoresist material derived from a photoresist resin having a third chemical property selected from the group consisting of epoxide equivalent weight, aromatic content, and crosslink density different from the first and second chemical properties.

3. The 3D structure of claim 1, wherein the composite photoresist material has a thickness ranging from about 6 to about 150 μm.

4. The 3D structure of claim 1, wherein each photoresist layer of the composite photoresist material is imaged with a radiation exposure wavelength selected from the group consisting of e-line, g-line, h-line, i-line, mid ultraviolet (UV), and deep UV radiation.

5. The 3D structure of claim 1, wherein each photoresist layer of the composite photoresist material is imaged with a different radiation exposure wavelength selected from the group consisting of e-line, g-line, h-line, i-line, mid ultraviolet (UV), and deep UV radiation.

6. The 3D structure of claim 1, wherein one or more layers of the composite photoresist material comprises a hydrophobicity agent.

7. A method for making a three-dimensional ("3D") structure from a composite photoresist film comprising the steps of:
(A) applying a first layer of photoresist material to a carrier film, the first layer being derived from a photoresist resin having a first chemical property selected from a group consisting of epoxide equivalent weight, aromatic content, and crosslink density;
(B) drying the first layer to provide a dried first layer;
(C) applying a second layer of photoresist material to the dried first layer, the second layer being derived from a photoresist resin having a second chemical property selected from a group consisting of epoxide equivalent weight, aromatic content, and crosslink density different from the first chemical property;
(D) drying the second layer to provide a composite photoresist material devoid of intermediate adhesion layer(s);

(E) applying an adhesion layer to a substrate surface;
(F) laminating the composite photoresist material to the adhesion layer;
(G) exposing the composite photoresist material to a radiation exposure wavelength selected from the group consisting of e-line, g-line, h-line, i-line, mid ultraviolet (UV), and deep UV radiation; and
(H) simultaneously developing the composite photoresist material to provide the 3D structure having varying physical and/or mechanical properties through a thickness thereof.

8. The method of claim 7, further comprising applying a third layer of photoresist material to a dried second layer to provide the composite photoresist material, wherein the third layer of photoresist material is derived from a photoresist resin having a third chemical property selected from the group consisting of epoxide equivalent weight, aromatic content, and crosslink density different from the first and second chemical properties.

9. The method of claim 7, wherein the composite photoresist material has a thickness ranging from about 6 to about 150 μm.

10. The method of claim 7, wherein each photoresist layer of the composite photoresist material is exposed to a different radiation exposure selected from the group consisting of e-line, g-line, h-line, i-line, mid ultraviolet (UV), and deep UV radiation.

11. The method of claim 7, wherein one or more layers of the composite photoresist material comprises a hydrophobicity agent.

12. A fluid ejection device having a fluid ejection head comprising:
a semiconductor substrate containing a plurality fluid ejection actuators on a device surface thereof and one or more fluid supply vias etched therethrough;
an adhesion promotion layer applied to the device surface of the semiconductor substrate;
a composite photoresist material applied to the adhesion promotion layer wherein the composite photoresist material comprises (a) a first photoresist layer derived from a photoresist resin having a first chemical property selected from a group consisting of epoxide equivalent weight, aromatic content, and crosslink density and (b) at least a second photoresist layer derived from a photoresist resin having a second chemical property selected from a group consisting of epoxide equivalent weight, aromatic content, and crosslink density different from the first chemical property, wherein the composite photoresist material is devoid of an adhesion promotion layer between layers of the composite photoresist material; and
a controller for activating the fluid ejection head.

13. The fluid ejection device of claim 12, wherein a composite photoresist material comprises at least a third layer of photoresist material derived from a photoresist resin having a third chemical property selected from the group consisting of epoxide equivalent weight, aromatic content, and crosslink density different from the first and second chemical properties.

14. The fluid ejection device of claim 12, wherein the composite photoresist material has a thickness ranging from about 6 to about 150 μm.

15. The fluid ejection device of claim 12, wherein each photoresist layer of the composite photoresist material is imaged with a radiation exposure wavelength selected from a group consisting of e-line, g-line, h-line, i-line, mid ultraviolet (UV), and deep UV radiation.

16. The fluid ejection device of claim 12, wherein each photoresist layer of a composite photoresist material is imaged with a different radiation exposure wavelength selected from the group consisting of e-line, g-line, h-line, i-line, mid ultraviolet (UV), and deep UV radiation.

17. The fluid ejection device of claim 12, wherein one or more layers of the composite photoresist material comprises a hydrophobicity agent.

* * * * *